United States Patent

Nitta et al.

[11] Patent Number: 5,081,376
[45] Date of Patent: Jan. 14, 1992

[54] LEVEL CONVERTER FOR CONVERTING ECL-LEVEL SIGNAL VOLTAGE TO TTL-LEVEL SIGNAL VOLTAGE

[75] Inventors: Shozo Nitta, Tokyo; Yasuhiro Sugimoto, Yokohama, both of Japan

[73] Assignee: Kabushiki Kaisha Toshiba, Kanagawa, Japan

[21] Appl. No.: 674,786

[22] Filed: Mar. 25, 1991

[30] Foreign Application Priority Data

Mar. 30, 1990 [JP] Japan .................................. 2-83920

[51] Int. Cl.$^5$ ............... H03K 19/086; H03K 19/0175
[52] U.S. Cl. .................................... 307/475; 307/455
[58] Field of Search ............... 307/475, 455, 456, 300

[56] References Cited

U.S. PATENT DOCUMENTS

| | | | |
|---|---|---|---|
| 4,536,665 | 8/1985 | Dayton | 307/475 |
| 4,835,455 | 5/1989 | Coddington et al. | 307/455 |
| 4,870,301 | 9/1989 | Petty | 307/455 |
| 4,883,990 | 11/1989 | Umeki | 307/455 |
| 4,996,452 | 2/1991 | Yee et al. | 307/475 |

Primary Examiner—Edward P. Westin
Assistant Examiner—Andrew Sanders
Attorney, Agent, or Firm—Banner, Birch, McKie & Beckett

[57] ABSTRACT

According to this invention, a level converter has a pair of differential transistors operated at a negative voltage in accordance with an ECL-level input signal, and first and second output nodes are arranged between a collector of one transistor of the pair of differential transistors and a positive power source voltage. A level-converting resistor for converting an ECL-level signal to a positive level signal is inserted between the first output node and the second output node so as to output the positive level signal in accordance with an ECL-level input signal to the first output node. The emitter-collector path of a bipolar transistor is inserted between the second output node and the positive power source voltage. A clamp potential for controlling saturation of transistors constituting a TTL circuit connected to an output of the transistor is generated by a constant potential applied to the base of the transistor.

5 Claims, 2 Drawing Sheets

LEVEL CONVERTER FOR CONVERTING ECL-LEVEL SIGNAL VOLTAGE TO TTL-LEVEL SIGNAL VOLTAGE

BACKGROUND OF THE INVENTION

1. Field of the Invention

The present invention relates to a level converter for converting a power source voltage level of an ECL (emitter-coupled logic) circuit to a power source voltage level of a TTL (transistor-transistor logic) circuit.

2. Description of the Related Art

A level converter is required to operate a TTL circuit having a positive power source as a power source voltage using a signal of an ECL-circuit level having a negative power source as a power source voltage.

For example, an ECL-level input signal is input to the bases of a pair of differential transistors. The collector of one transistor of the pair of differential transistors is connected to a ground voltage GND. A power source voltage VCC is applied to the collector of the other transistor through a level-converting resistor. The collector current of the other transistor is controlled by the ECL-level input signal, and a voltage determined by the voltage drop of the level converting resistor applied with the power source voltage VCC is output as a signal level for the TTL circuit.

Since a TTL circuit is a circuit using a saturation region of a transistor, it is disadvantage to a high-speed operation. In order to obtain the high-speed operation, a clamp circuit for controlling saturation of transistors constituting the TTL circuit is frequently incorporated in the TTL circuit.

When a clamp voltage required for a clamp circuit in the TTL circuit is generated from a level converter, a clamp level can be arbitrarily set by the level converter. For this reason, a resistor connected in series with a level-converting resistor connected to the collectors of the pair of differential transistors receiving an ECL-level signal is arranged, and a power source voltage VCC supplied to the transistors is divided by the resistors, thereby obtaining a clamp level.

However, the method of obtaining the clamp level with the above arrangement has the following drawbacks.

First, a resistor component for defining a time constant of charging/discharging of a capacitance C parasitized in a TTL-level output node is increased by the level-converting resistor and the resistor connected in series therewith, thereby causing a level-converting speed to be decreased.

Second, a clamp level determined by dividing the power source voltage VCC by the level-converting resistor and the resistor connected in series therewith is varied by an influence of a change in voltage due to the level-converting resistor for obtaining a TTL level.

SUMMARY OF THE INVENTION

It is, therefore, an object of the present invention to provide a level converter capable of increasing an operation speed and obtaining a stable clamp potential applied to a TTL output circuit.

The object of the present invention can be achieved by the following arrangement.

A level converter comprises a current switching means consisting of a pair of differential transistors operated at a negative voltage by an input signal, a first potential connected to a collector of one transistor of the pair of differential transistors, a first output node which is arranged to the other transistor of the pair of differential transistors and a potential of which is switched by the current switching means, a first load element inserted between the first output node and the first potential, a level-converting transistor one terminal of which receives a second potential and a control terminal of which receives a third potential to apply a predetermined potential to the other terminal of the level-converting transistor, a second output node arranged to the other terminal of the level converting transistor, and a second load element inserted between the first output node and the second output node.

With the above arrangement, a time constant obtained when a parasitic capacitance of the output node is charged/discharged is reduced by the level-converting transistor connected between the second potential and the second output node. The control terminal of the level-converting transistor is connected to the third potential, i.e., a constant voltage source, to stabilize the voltage of the second output node.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENTS

An embodiment of the present invention will be described below with reference to the accompanying drawings.

Figure 1:
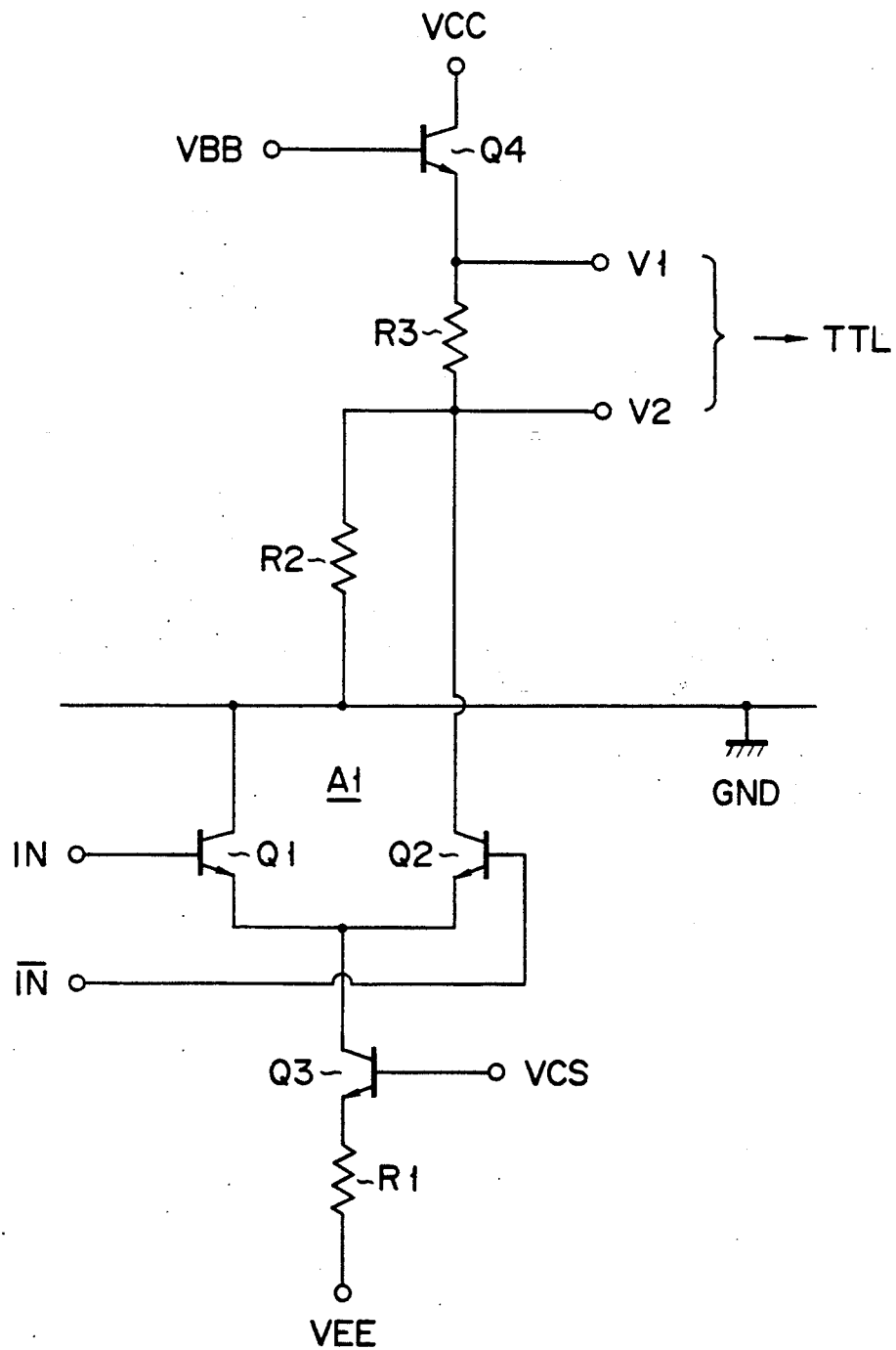
FIG. 1 is a circuit diagram showing an arrangement according to the first embodiment of the present invention.

FIG. 1 is a circuit diagram showing an arrangement of a level converter according to the embodiment of the present invention. The bases of npn transistors Q1 and Q2 are input terminals IN and $\overline{\text{IN}}$ of ECL-level signals. Both the transistors Q1 and Q2 are a pair of differential transistors of a differential pair A1. The emitters of the transistors Q1 and Q2 are connected to the collector of an npn transistor Q3. The base of the transistor Q3 is connected to a constant voltage source VCS, and the emitter of the transistor is connected to a negative power source VEE through a resistor R1.

The collector of the transistor Q1 is connected to a ground voltage GND and to one terminal of a resistor R2. The other terminal of the resistor R2 is connected to the collector of the transistor Q2 and to one terminal of a resistor R3. The other terminal of the resistor R3 is connected to the emitter of an npn transistor Q4. The collector of the transistor Q4 is connected to a power source voltage VCC, and a constant voltage VBB is applied to the base of the transistor Q4. An output node V1 is connected to the connecting point between the resistor R3 and the transistor Q4, and an output node V2 is connected to the connecting point between the resistors R2 and R3 and the collector of the transistor Q2.

An operation of the circuit with the above arrangement will be described below. When ECL-level input signals are supplied to the input terminals IN and $\overline{\text{IN}}$, the input signals are switched to currents by switching of the transistors Q1 and Q2 in the differential circuit A1 and output as level-converted voltage signals to the TTL-level output nodes V1 and V2. The output signals are converted into TTL-level signals through a TTL output circuit.

In the circuit with the above arrangement, the base of the transistor Q4 is connected to the constant voltage source VBB, and the output node V1 is used as a virtual constant potential point. Therefore, a potential of only the output node V2 is raised/dropped by an ON/OFF operation of the transistors. A clamp voltage, for preventing the transistor Q2 from perfect saturation, applied to the transistor in the TTL output circuit (not shown) using a constant potential of the output node V1 can be easily generated.

Note that, when the transistor Q2 is set in an OFF state and no collector current is supplied to the transistor Q2, the resistor R2 is used for supplying some current to the resistor R3. Thus, the levels of the output nodes V1 and V2 are corrected, and the operation speed thereof is stabilized.

An output impedance of a signal supplied to the output node V1 is decreased by the transistor Q4 for determining the output node V1 so as to reduce a time constant of charging/discharging defined by the parasitic capacitances of the output nodes V1 and V2. As a result, a speed of a converting operation from an ECL circuit level to a TTL circuit level can be increased.

Figure 2:
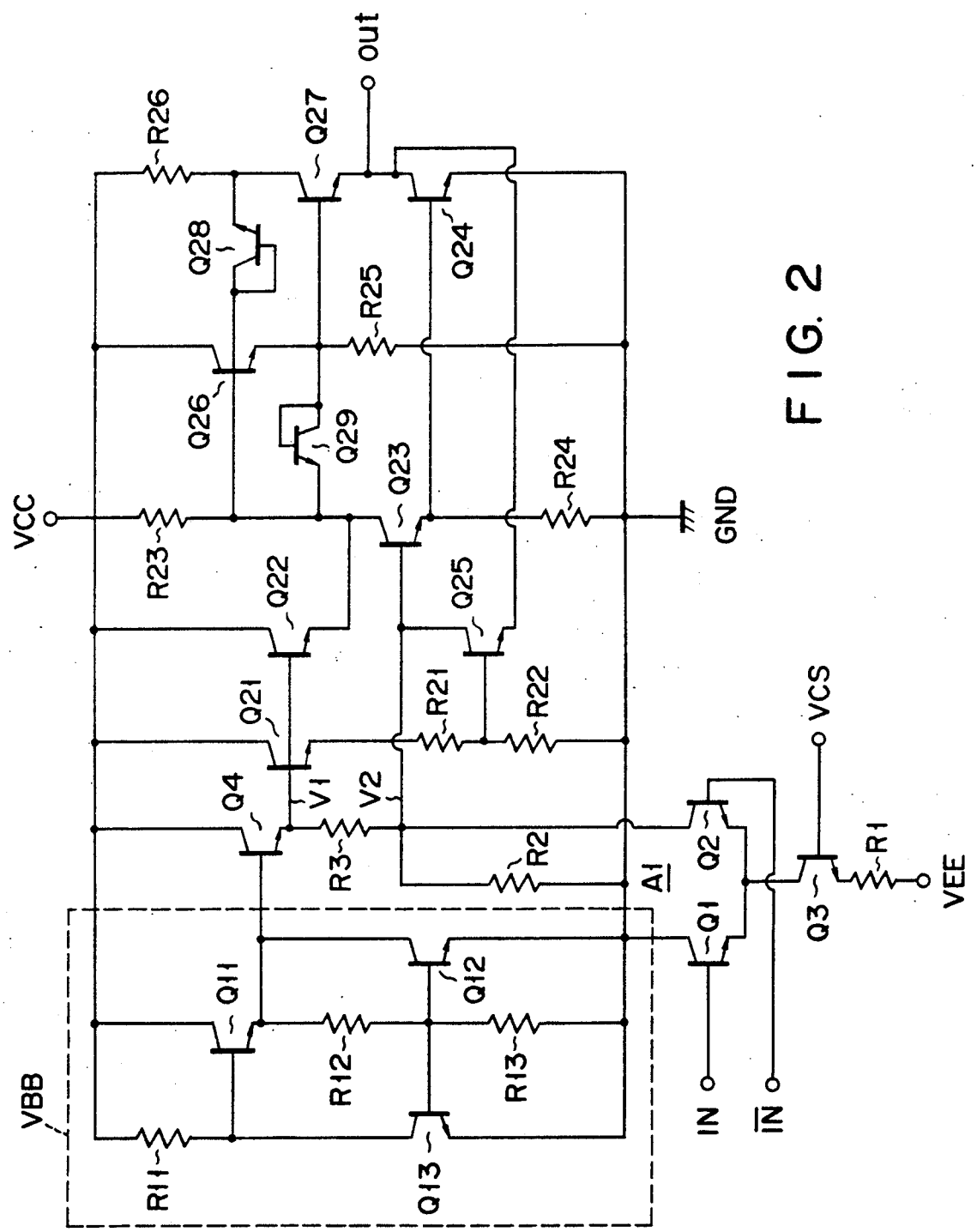
FIG. 2 is a circuit diagram showing an arrangement wherein a level converter according to the present invention is connected to a TTL output circuit.

FIG. 2 is a circuit diagram showing an arrangement wherein a level converter according to the present invention is connected to a TTL circuit, and an arrangement of the constant voltage source VBB and the TTL output circuit in FIG. 1 according to the embodiment of the present invention.

The constant voltage source VBB which is not easily affected by a variation in power source VCC is preferably used, and it has the following arrangement. The collector of the npn transistor Q11 is connected to the positive power source VCC, and the base of the transistor Q11 is connected to the positive power source VCC through a resistor R11. The emitter of the transistor Q11 is connected to the base of the transistor Q4 in the level converter of the present invention and to a ground voltage GND through series-connected resistors R12 and R13. The bases of npn transistors Q12 and Q13 are connected to a connection point between the resistors R12 and R13. The collector of the transistor Q12 is connected to the base of the transistor Q4, and the collector of the transistor Q13 is connected to the base of the transistor Q11. The emitters of the transistors Q12 and Q13 are connected to the ground voltage GND.

The TTL output circuit is arranged as follows. The bases of npn transistors Q21 and Q22 the collectors of which are connected to the positive power source VCC are connected to one output node V1 in the level converter of the present invention. The emitter of the transistor Q21 is connected to the ground voltage GND through series-connected resistors R21 and R22. The emitter of the transistor Q22 is connected to the collector of an npn transistor Q23 the base of which is connected to the other node V2 in the level converter. The collector of the transistor Q23 is connected to the power source voltage VCC through a resistor R23, and the emitter of the transistor Q23 is connected to the ground voltage GND through a resistor R24 and to the base of an npn transistor Q24 the collector of which is connected to an output terminal OUT. The emitter of an npn transistor Q25 is connected to the collector of the transistor Q24. The base of the transistor Q25 is connected to the connection point between the resistors R21 and R22, and the collector of the transistor Q25 is connected to the output node V2.

The base of an npn transistor Q26 is connected to the connection point between the transistor Q23 and the resistor R23, the collector of the transistor Q26 is connected to the positive power source VCC, the emitter of the transistor Q26 is connected to the ground voltage GND through the resistor R25. The base of an npn transistor Q27 the emitter of which is connected to the output terminal OUT is connected to the connection point between the emitter of the transistor Q26 and the resistor R25. The collector of the transistor Q27 is connected to the positive power source VCC through a resistor R26.

The collector-emitter of an npn transistor Q28 the base of which is connected to the collector of the transistor Q28 is connected between the base of the transistor Q26 and the collector of the transistor Q27. The collector-emitter of an npn transistor Q29 the base of which is connected to the collector of the transistor Q29 is connected between the emitter and base of the transistor Q26.

An operation of the level converter of the present invention will be described below by using a circuit having the above arrangement.

ECL-level input signals are supplied to input terminals IN and $\overline{\text{IN}}$. When the terminal IN is set to e "H" level and the terminal $\overline{\text{IN}}$ is set to be "L" level, the transistor Q1 in the differential circuit A1 is turned on, and the transistor Q2 is turned off. Since no collector current is supplied to the transistor Q2, the output node V2 has a high potential. Therefore, the transistors Q23 and Q24 are turned on, and the transistors Q26 and Q27 are turned off, thereby dropping the potential of the output terminal OUT.

When the terminal IN is set to be "L" level and the terminal $\overline{\text{IN}}$ is set to be "H" level, the transistor Q1 in the differential circuit A1 is turned off, and the transistor Q2 is turned on. Since a collector current is supplied to the transistor Q2, the output node V2 has a low potential. Therefore, the transistors Q23 and Q24 are turned off, and the transistors Q26 and Q27 are turned on, thereby increasing the potential of the output terminal OUT. Meanwhile, the transistor Q22 applies a saturation protecting clamp voltage to the collector of the transistor Q23, and the transistor Q25 applies a saturation protecting clamp voltage to the collector of the transistor Q24. Therefore, the transistors Q23 and Q24 are prevented from perfect saturation. The clamp voltages are determined by the output node V1. As the current of the differential circuit A1 is switched, the potential of the output node V2 is raised and dropped. However, the potential of the output node V1 is held to be almost constant by the transistor Q4 operated by the constant voltage source VBB.

According to the circuit with the above arrangement, a time constant of charging/discharging of a parasitic capacitance produced when the current of the differential circuit A1 is switched is reduced by the transistor Q4. As a result, a speed of a converting operation from the ECL circuit level to the TTL circuit level can be increased. In addition, since a virtual constant potential point is formed in the emitter of the transistor Q4 of the level converter section, the level of a clamp potential in the TTL output circuit can be easily set.

As described above, according to the present invention, since a transistor the base of which receives a constant potential is used as a level converter section, an output impedance is set to be small. In this case, a time constant of charging/discharging of the parasitic capacitance of an output node can be reduced, thereby increasing an operation speed. In addition, a clamp potential applied to a TTL output circuit can be stabilized, and a highly reliable level converter can be provided.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A level converter for converting an ECL-level signal voltage to a positive level signal voltage, comprising:

current switching means consisting of a pair of differential transistors operated at a negative voltage by an input signal;

a first potential connected to a collector of one transistor of said pair of differential transistors;

a first output node connected to a collector of the other transistor of said pair of differential transistors;

a first load element inserted between said first output node and said first potential;

a level-converting transistor one terminal of which receives the second potential and a control terminal of which receives a third potential to apply a constant potential to the other terminal;

a second output node arranged to the other terminal of said level-converting transistor; and a second load element used for level conversion and inserted between said first output node and said second output node.

2. A converter according to claim 1, wherein said level converting transistor is an npn bipolar transistor, and a clamp voltage for controlling saturation of transistors constituting a TTL circuit to be connected to an output of said transistor is generated from said second output node.

3. A level converter for converting an ECL-level signal voltage to a positive level signal voltage, comprising:

current switching means consisting of a pair of differential transistors operated at a negative voltage by an input signal;

a first potential connected to a collector of one transistor of said pair of differential transistors;

a first output node connected to a collector of the other transistor of said pair of differential transistors;

a first load element used for level correction and inserted between said first output node and said first potential;

a second load element which is used for level conversion and one terminal of which is connected to said first output node;

a level-converting transistor an emitter-collector of which is connected between the other terminal of said second load element and a second potential;

a constant voltage source connected to a base of said level-converting transistor; and a second output node connected to an emitter of said level-converting transistor.

4. A converter according to claim 3, wherein said level-converting transistor is an npn bipolar transistor, and a clamp voltage for controlling saturation of transistors constituting a TTL circuit to be connected to an output of said transistor is generated from said second output node.

5. A converter according to claim 3, wherein said constant voltage source is arranged such that collectors of two transistors controlled by a voltage obtained by a dividing resistor are connected to a base and an emitter of a constant voltage outputting transistor, respectively.

* * * * *